United States Patent [19]
Lee et al.

[11] Patent Number: 5,471,429
[45] Date of Patent: Nov. 28, 1995

[54] BURN-IN CIRCUIT AND METHOD THEREFOR OF SEMICONDUCTOR MEMORY DEVICE

[75] Inventors: Seung-Keun Lee; Choong-Keun Kwak, both of Seoul, Rep. of Korea

[73] Assignee: Samsung Electronics Co., Ltd., Suwon, Rep. of Korea

[21] Appl. No.: 348,180

[22] Filed: Nov. 28, 1994

[30] Foreign Application Priority Data

Nov. 26, 1993 [KR] Rep. of Korea ............... 1993-25324

[51] Int. Cl.$^6$ ................................................. G11C 7/00
[52] U.S. Cl. ........................................ 365/201; 371/21.1
[58] Field of Search ................................ 365/201, 193, 365/194; 371/21.1

[56] References Cited

U.S. PATENT DOCUMENTS

| | | | |
|---|---|---|---|
| 4,380,805 | 4/1983 | Proebsting | 365/201 |
| 5,276,647 | 1/1994 | Matsui et al. | 365/201 |
| 5,282,167 | 1/1994 | Tanaka et al. | 365/201 X |
| 5,293,340 | 3/1994 | Fujita | 365/201 |
| 5,353,254 | 10/1994 | Sakamoto | 365/201 |
| 5,371,710 | 12/1994 | Ogihara | 365/201 |
| 5,373,472 | 12/1994 | Ohsawa | 365/201 |

Primary Examiner—David C. Nelms
Assistant Examiner—Son Dinh
Attorney, Agent, or Firm—Charles R. Donohoe; Stephen R. Whitt

[57] ABSTRACT

The present invention pertains to semiconductor memory devices and more particularly to a burn-in circuit of such devices and burn-in method which improve reliability of a static random access memory RAM. The semiconductor memory device according to the present invention, which includes a memory cell array in which a plurality of memory cells are stored in the directions of row and column, a row decoder for selecting the row of the memory cell array, and a column decoder for selecting the column of the memory cell array, comprises an input/output line control circuit formed between a data input/output pin disposed on the same chip and the column of the memory cell array for transmitting data inputted/outputted through the data input/output pin, a read/write control circuit for supplying a signal which controls input/output of data in the memory cell array to the input/output line control circuit, and a burn-in control circuit for inputting the output signal of the read/write control circuit, supplying a burn-in signal responsive to the data input through the input/output line control circuit to the row decoder and column decoder, and enabling a burn-in test of the same chip after a package process.

24 Claims, 3 Drawing Sheets

BURN-IN CIRCUIT AND METHOD THEREFOR OF SEMICONDUCTOR MEMORY DEVICE

BACKGROUND OF THE INVENTION

The present invention pertains to semiconductor memory devices and more particularly to a burn-in circuit of such devices and burn-in method which improve reliability of a static random access memory RAM.

In the semiconductor memory device such as a dynamic RAM or a static RAM, a burn-in is typically performed before or after package process of a chip, in order to the reliability of internal circuits therein. Such a burn-in test is required to detect defects or strength of memory cells stored in the same chip, for which an exterior supply voltage or a higher voltage more than the supply voltage is supplied to each of the memory cells, thereby checking whether the memory cells are in good state or in bad state. The burn-in test has been actually carried out in the semiconductor industry and further much endeavors for performing more effective burn-in test have been made.

In the meanwhile, such a burn-in test is typically different, upon applying a burn-in method to a dynamic RAM and a static RAM, since their memory cell structures are different from each other. As can be well known in the art, in the dynamic RAM, a single memory cell is comprised of one storage capacitor and one access transistor, while in the static RAM, a single memory cell is comprised of six transistors, or two resistors and four transistors. Here, in case of the dynamic RAM, since the memory cell structure is made up of a volatile memory element having a discharging feature of data, the memory cell must restore data at intervals of a constant time, i.e., must execute a refresh operation. But in case of the static RAM, since the memory cell structure is made up of a latch construction, the memory cell does not need to execute the refresh operation separately. Accordingly, it can be appreciated that the burn-in tests are different in the dynamic RAM and the static RAM due to the structural feature of each memory cell. For the details, the following description will be made.

The technique on the burn-in test of the semiconductor memory device particularly having a memory cell structure in the dynamic RAM is disclosed in U.S. Pat. No. 4,380,805 filed Apr. 19, 1983 by the inventor Robert J Proebsting, entitled "Tape Burn-In Circuit". In the prior art, the burn-in test is carried out in a wafer state to reduce the time consumed for the burn-in test. That is, this prior art is defined to the semiconductor memory device such as the dynamic RAM having a memory cell structure necessitating a refresh operation. In operation, there are a plurality of extra pads and a signal is applied thereto to cause all the rows and columns positioned on the same chip to be enabled. Through this process, all of the memory cell in the chip are selected and the burn-in therefor is simultaneously performed in the wafer state. If the burn-in is executed as discussed above, there is an advantage in that the burn-in time spend by the burn-in operation can be considerably reduced, whereas there is a disadvantage in that a separate device capable of performing the burn-in operation in the wafer state has to be used. In addition, a plurality of extra pads as means which supplies a burn-in voltage to the memory cells in the wafer state have to be formed on the same ship.

Meanwhile, the prior art can not been applied to the static RAM since a refresh function used in the dynamic RAM is applied therein. The memory cell in the dynamic RAM is comprised of one storage capacitor and one access transistor, so that no problem occurs even though the burn-in for all the memory cells are carried out at a time. However, since the static RAM does not have any refresh function, the method of accessing the memory cell is achieved only by performing a reading/writing operation. Therefore, in the case where the prior art is applied to the static RAM, the number of memory cells connected to a write driver as a circuit which enables the writing operation to the memory cells of the static RAM becomes large, thus a normal writing operation for each memory cell is not executed and accordingly the burn-in operation for the desired number of memory cells can not be achieved completely. This difficulty has to be considered as the integrity of a chip is increased. Hence, when the burn-in test is performed in the static RAM, the desired number of rows and the desired number of columns have been at the same time enabled typically. If, like the prior an mentioned above, the burn-in test in the wafer state is performed in the static RAM, there are various problems, such as purchase of an expensive equipment required for the burn-in, time restriction consumed for the burn-in, etc. As a result, it has been estimated that the burn-in test of the static RAM in the wafer state suffers from much difficulties.

SUMMARY OF THE INVENTION

It is therefore an object of the present invention to provide a burn-in circuit which can perform a reliable burn-in test in a package state for a semiconductor memory, device such as a static RAM.

It is another object of the present invention to provide a burn-in circuit which can perform a reliable burn-in test in a package state for a semiconductor memory device such as a static RAM as well as does not need to require a separate burn-in test equipment.

It is still another object of the present invention to provide a burn-in circuit which can perform a burn-in test at a high speed in a package state for a semiconductor memory device such as a static RAM.

It is yet another object of the present invention to provide a burn-in circuit which can perform a burn-in test in a package state for a semiconductor memory device such as a static RAM and upon burn-in test, select all the memory cells positioned on the same chip at the same time.

It is yet still another object of the present invention to provide a burn-in circuit which can perform a burn-in test in a package state for a semiconductor memory device such as a static RAM and upon burn-in test, select all the memory cells positioned on the same chip at the same time, thereby reducing a burn-in testing time to the minimum.

To achieve these objects of the present invention, the present invention is directed to a burn-in test in a semiconductor memory device after the completion of package process.

In accordance with the present invention, there is provided a burn-in control circuit for enabling the selection of all the memory cells in a chip during a burn-in test.

The semiconductor memory device according to the present invention, which includes a memory cell array in which a plurality of memory cells are stored in the directions of row and column, a row decoder for selecting the row of the memory cell array, and a column decoder for selecting the column of the memory cell array, comprises an input/output line control circuit formed between a data input/output pin disposed on the same chip and the column of the memory cell array, for transmitting data inputted/outputted through the data input/output pin, a read/write control circuit for supplying a signal which controls input/output of data in the memory cell array to the input/output line control circuit, and a burn-in control circuit for inputting the output signal of the read/write control circuit, supplying a burn-in signal responsive to the data input through the input/output line control circuit to the row decoder and column decoder, and enabling a burn-in test of the same chip after a package process.

A burn-in method of performing a burn-in test on the same chip after a package process of a chip in the semiconductor memory device according to the present invention which includes a memory cell array in which a plurality of memory cells are stored in the directions of row and column, a row decoder for selecting the row of the memory cell array, a column decoder for selecting the column of the memory cell array, an input/output line control circuit formed between a data input/output pin disposed on the same chip and the column of the memory cell array for transmitting data inputted/outputted through the data input/output pin, and a read/write control circuit for supplying a signal which controls input/output of data in the memory cell array to the input/output line control circuit, comprises the steps of inputting data provided from the input/output line control circuit and in response thereto outputting a burn-in mode enable signal by a burn-in mode enable part in correspondence with the output signal of the read/write control circuit, inputting data provided from the input/output line control circuit and in response thereto outputting a normal mode enable signal by a normal mode enable part in correspondence with the output signal of the read/write control circuit, generating a burn-in signal by a burn-in signal generating part having a first fuse cut off by inputting the output signal of the burn-in mode enable signal in response to the cutting operation of the first fuse and supplying the burn-in signal to the row decoder and column decoder, and generating a burn-in control signal by a burn-in control signal generating part having a second fuse cut off by inputting the output signal of the normal mode enable signal in response to the cutting operation of the second fuse and supplying the burn-in control signal to the burn-in mode enable part and normal mode enable part.

BRIEF DESCRIPTION OF THE DRAWINGS

These and other objects, features, and advantages of the present invention are better understood by reading the following detailed description of the invention, taken in conjunction with the accompanying drawings. In the drawings, it should be noted that like elements represent like symbols or reference numerals, wherein.

DETAILED DESCRIPTION OF THE PREFERRED EMBODIMENT

In the following description, specific detailed circuits are set forth such as a burn-in mode enable part, normal mode enable part, burn-in signal generating part and burn-in control signal generating part in order to provide a thorough understanding of the present invention. It will, however, be obvious to one skilled in the art that the present invention may be practiced without these specific detailed circuits.

The term "a read/write control circuit" means a circuit which controls a reading/writing operation in memory cells arranged in a memory cell array, which is commonly used in the art and will be recited in the appended claims as well.

Figure 1:
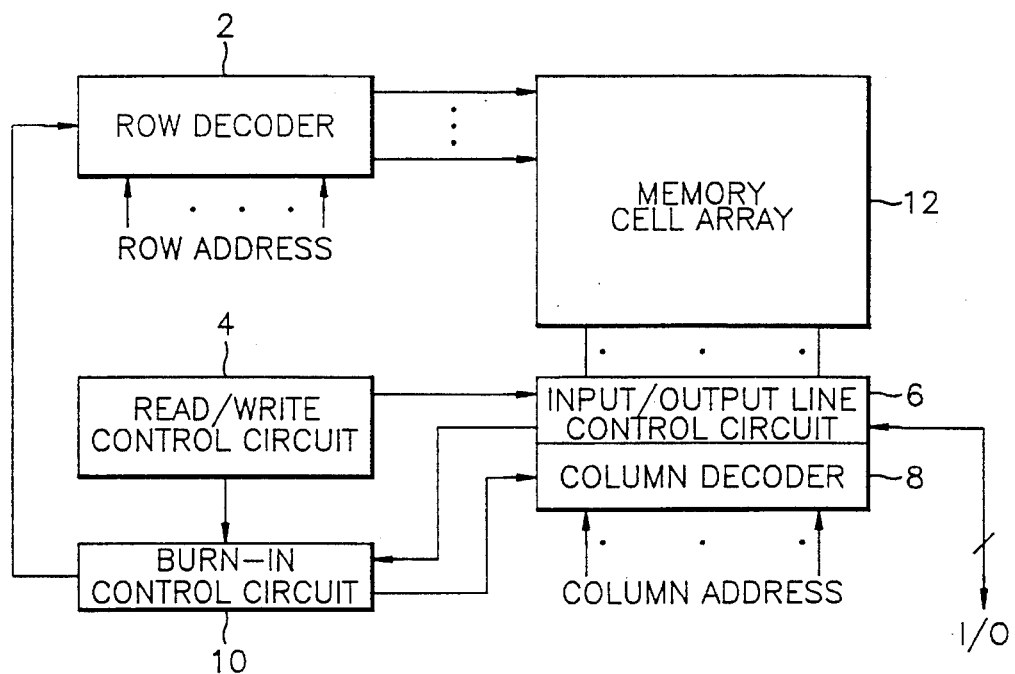
FIG. 1 is a schematic block diagram illustrating a semiconductor memory device with a burn-in circuit according to the present invention.

FIG. 1 is a schematic block diagram illustrating a semiconductor memory device with a burn-in circuit according to the present invention. In addition to a typical memory cell array 12 and associated circuits for reading/writing data in the memory cell array 12, a burn-in control circuit 10 according to the present invention is included in FIG. 1. In the figure, it should be noted that the burn-in control circuit 10 receives the outputs of the read/write control circuit 4 and an input/output control signal 6 and in response thereto controls a row decoder 2 and a column decoder 8. The feature of burn-in method according to the present invention lies in that the burn-in control circuit 10 operates upon completion of package process of a chip to reduce a burn-in time. For this operation, the burn-in control circuit determines whether the burn-in test is performed by using an inputted I/O signal to become a burn-in mode simultaneously. The output of the burn-in control circuit 10 controls the row decoder 2 and column decoder 8 which select the row and column of the memory cell array 12, respectively. Thus, the row decoder 2 and column decoder 8 select at the same time the memory cells of the memory cell array 12 to proceed with the burn-in test, and upon completion of this burn-in test, it proceeds to a typical normal mode like the reading/writing operation. Such a burn-in test method will be discussed referring to an embodiment of each circuit. In the meanwhile, the burn-in control circuit 10 comprises an input switching part for inputting data through the embodiments as will be discussed hereinafter, and a burn-in controller for generating a burn-in control signal in response to the output signal of the input switching part.

The following embodiments will disclose a method applied to the static RAM having eight I/O pins on the same chip. Moreover, explanations on operations associated with the burn-in test of the embodiments will be given after the construction of each embodiment is described.

Figure 2:
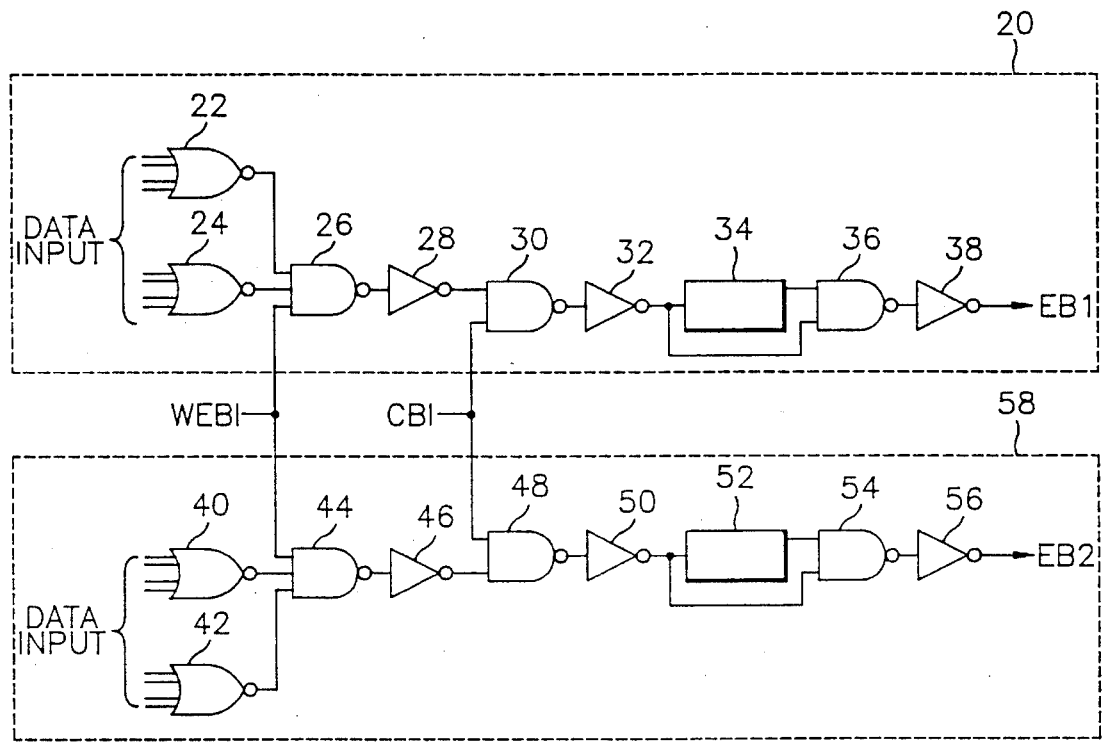
FIG. 2 is a circuit diagram illustrating an embodiment of an input switching part in the burn-in circuit according to the present invention.

FIG. 2 is a circuit diagram illustrating an embodiment of the input switching part in the burn-in circuit according to the present invention, which comprises a burn-in mode enable part 20 for enabling a burn-in mode from a data input signal and a normal mode enable part 58 for enabling a normal mode from a data input signal. For the details, the burn-in mode enable part 20 is comprised of a NOR gate 22 for inputting four signals of eight data input signals inputted from the eight input pins, a NOR gate 24 for inputting the rest of four data input signals, a NAND gate 26 for inputting a signal WEBI which is generated by a write enable signal $\overline{WE}$ and informs the approach to the burn-in mode and inputting the output signal of each of the NOR gates 22 and 24, and an inverter 28 for inputting the output signal of the NAND gate 26. Furthermore, the burn-in mode enable part 20 is comprised of a NAND gate 30 for inputting a burn-in control signal CBI and the output signal of the inverter 28, an inverter 32 for inputting the output signal of the NAND gate 30, a delay circuit 34 for delaying for a predetermined time the output signal of the inverter 32, a NAND gate 36 for inputting the output signals of the inverter 32 and the delay circuit 34, and an inverter 38 for inputting the output signal of the NAND gate 36 and outputting a burn-in mode enable signal EB1. In the meanwhile, the normal mode enable part 58 is comprised of a NOR gate 40 for inputting four signals of eight data input signals inputted from the eight input pins, a NOR gate 42 for inputting the rest of four data input signals, a NAND gate 44 for inputting the signal $\overline{WEBI}$ which is generated by the write enable signal $\overline{WE}$ and informs the approach to the burn-in mode and inputting the output signal of each of the NOR gates 40 and 42, and an inverter 46 for inputting the output signal of the NAND gate 44. Furthermore, the normal mode enable part 58 is comprised of a NAND gate 48 for inputting the burn-in mode control signal CBI and the output signal of the inverter 46, an inverter 50 for inputting the output signal of the NAND gate 48, a delay circuit 52 for delaying for a predetermined time the output signal of the inverter 50, a NAND gate 54 for inputting the output signals of the inverter 50 and the delay circuit 52, and an inverter 56 for inputting the output signal of the NAND gate 54 and for outputting a normal mode enable signal EB2. Operations of the normal mode enable signals EB1 and EB2 will be explained hereinafter. The construction of the delay circuits 34 and 52 may be easily made with a circuit such as an inverter chain.

Figure 3:
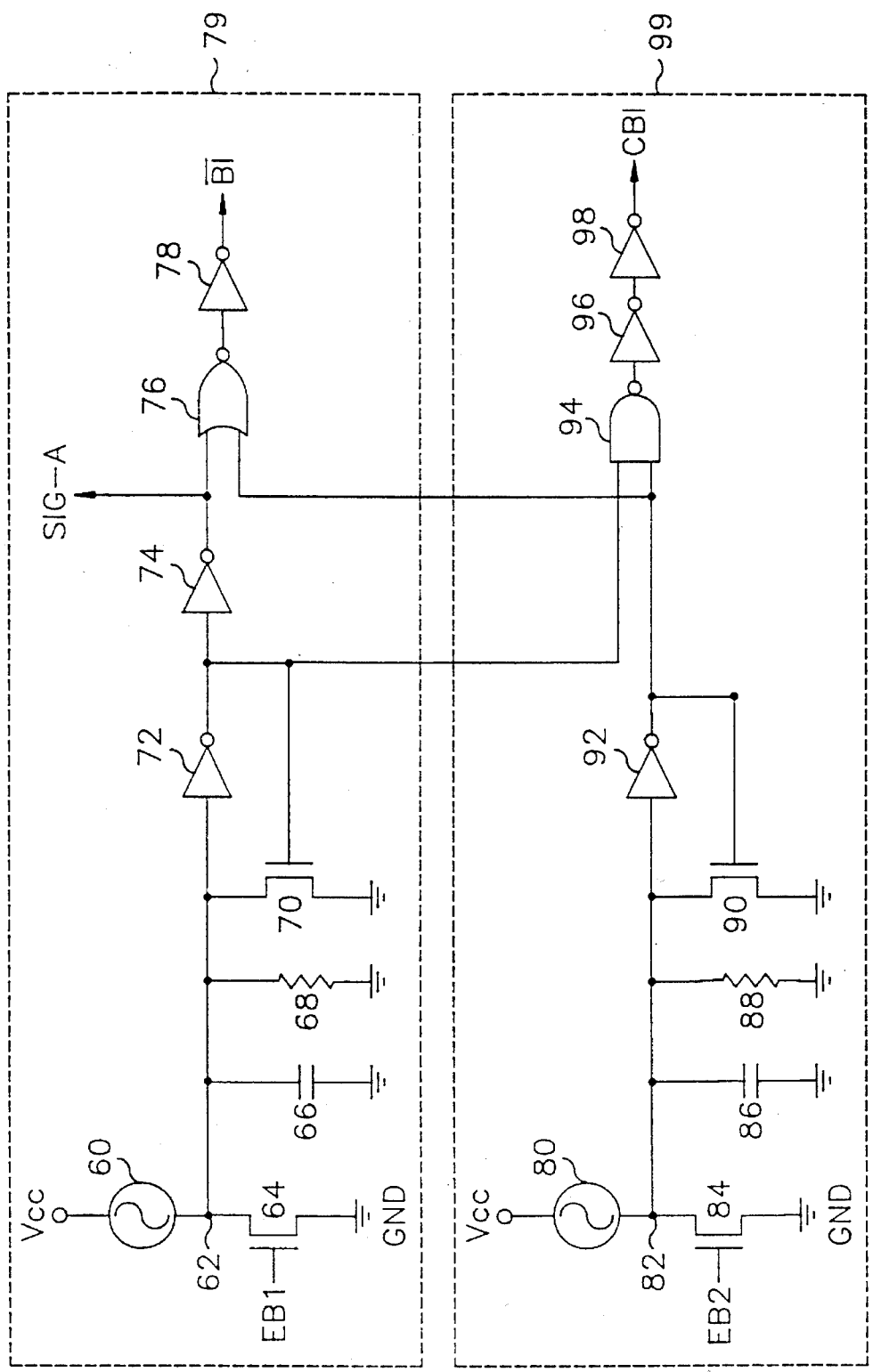
FIG. 3 is a circuit diagram illustrating an embodiment of a burn-in control part in the burn-in circuit according to the present invention.

FIG. 3 is a circuit diagram illustrating an embodiment of the burn-in control part which outputs the burn-in signal, which comprises a burn-in signal generating part 79 for outputting a burn-in signal $\overline{BI}$ and a burn-in control signal generating part 99 for outputting the burn-in control signal CBI. For the details, the burn-in signal generating part 79 is comprised of a first fuse 60 connected between a power supply voltage Vcc and a connecting node 62, an NMOS transistor 64 having a channel connected between the connecting node 62 and ground GND and having a gate terminal to which the burn-in mode enable signal EB1 is supplied, an inverter 72 connected to the connecting node 62 at the input terminal thereof, an NMOS transistor 70 having a channel connected between the connecting node 62 and ground GND and having a gate terminal to which the output signal of the inverter 72 is supplied, an inverter 74 for inputting the output signal of the inverter 72, a NOR gate 76 for inputting the output signal of the inverter 74 as one input, and an inverter 78 for inputting the output signal of the NOR gate 76 and outputting the burn-in signal $\overline{BI}$. A capacitor 66 and a resistor 68 are connected to the connecting node 62 for the purpose of stabilizing the voltage level supplied. In the meanwhile, the burn-in control signal generating part 99 is comprised of a second fuse 80 connected between a power supply voltage Vcc and a connecting node 82, an NMOS transistor 84 having a channel connected between the connecting node 82 and ground GND and having a gate terminal to which the normal mode enable signal EB2 is supplied, an inverter 92 connected to the connecting node 82 at the input terminal thereof and whose output signal is supplied to the NOR gate 76 as one input, an NMOS transistor 90 having a channel connected between the connecting node 82 and ground GND and having a gate terminal to which the output signal of the inverter 92 is supplied, a NAND gate 94 for inputting the output signals of the inverters 92 and 72, an inverter 96 for inputting the output signal of the NAND gate 94, and an inverter 98 for inputting the output signal of the inverter 96 and outputting the burn-in control signal CBI. A capacitor 86 and a resistor 88 are connected to the connecting node 82 for the purpose of stabilizing the voltage level supplied. Also, the burn-in control signal CBI is supplied to each of one input of the NAND gates 30 and 48 as depicted in FIG. 2, respectively. Meanwhile, in the constitution of FIG. 3, when the signals EB1 and EB2 are respectively inputted at "high" levels, the first and second fuses 60 and 80 are made up of an electric fuse cut off by the excessive current flow, respectively. This fact is of course well known in the art.

Figure 4:
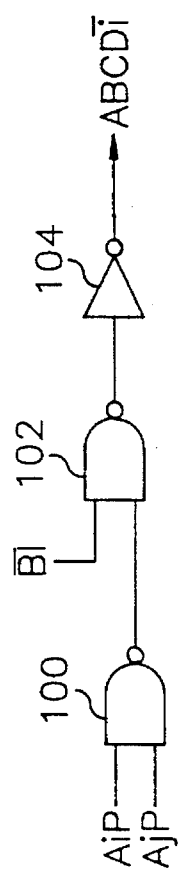
FIG. 4 is a circuit diagram illustrating an embodiment in which a burn-in signal according to the present invention is connected to a conventional decoder.

FIG. 4 is a circuit diagram illustrating an embodiment in which the burn-in signal $\overline{BI}$ according to the present invention is supplied to the conventional decoder, and thereby the decoder is under the control of the burn-in signal $\overline{BI}$. In the figure, there are provided a NAND gate 100 for inputting addresses AiP and AjP, a NAND gate 102 for respectively inputting the output signal of the NAND gate 100 and the burn-in signal $\overline{BI}$, and an inverter 104 for inputting the output signal of the NAND gate 102 and outputting a signal $\overline{ABCDi}$ which selects a desired row and column. Under this condition, if the burn-in signal $\overline{BI}$ in the "low" level is inputted to the NAND gate 102, the signal $\overline{ABCDi}$ is outputted at the "low" level regardless of the inputs of the addresses AiP and AjP to cause the desired row and column to be selected.

An operational characteristic of the burn-in method according to the present invention will be discussed with reference to FIGS. 2 to 4. As is known generally, the burn-in procedure following the package process of chip is in order of a preburn-in test, real burn-in test and postburn-in test. Thus, the preburn-in test is performed before the burn-in test, and the real burn-in test is then executed with only the device passing the preburn-in process as mentioned above. Accordingly, the burn-in control circuit of FIG. 1 operates for such passed device. In the meanwhile, a few data input for the burn-in test are used before the production of the device. That is, I/O data inputted from the eight pins is defined as 00000000, 11111111, 10101010 and 01010101. Here, it should be noted that the burn-in method according to the present invention has the following characteristic. When a specific data input signal as operating the burn-in control signal 10 by using the data input signal is then applied, the first fuse 60 is cut off and the burn-in mode is executed to enable a plurality of rows and columns. To the contrary, when a specific data input signal different from the data input signal is applied, the second fuse 80 is cut off to be in a normal operation state. However, if the first and second fuses 60 and 80 are cut off, the burn-in control circuit 10 does not operate. Referring back to FIG. 2, if a specific data signal, e.g., 10010011, not being used in the test is inputted in the write operation, the NOR gates 22 and 24 which input the data signal are enabled. The signal WEBI controlled by the write enable signal $\overline{WE}$ goes to the "high" state during writing, while goes to the "low" state during reading. Thus, when the outputs of the NOR gates 22 and 24 and the signal WEBI are all at the "high" states, the output of the NAND gate 26 goes to the "low" state and the output of the inverter 28 goes to the "high" state. The signal CBI which is generated by the burn-in control signal generating part 99 of FIG. 3 remains at the "high" state before and during burn-in, and the signal CBI falls to the "low" state if the first and second fuses 60 and 80 are all cut off. If the output of the inverter 28 and the signal CBI go to the "high" states, the output of the NAND gate 30 is at the "low" state and the output of the inverter 32 is at the "high" state. As a result, through the delay circuit 34, NAND gate 36 and inverter 38, the signal EB1 goes to the "high" state. In the meanwhile, the signal EB1 is changed to the "high" state, in the constitution of FIG. 3, the NMOS transistor 64 is turned on and the first fuse is cut off due to the excessive current flow thereto. Thereby, the connecting node 62 is changed to the "low" state. As a result, the output of the inverter 72 goes to "high" state and the output of the inverter 74 goes to "low" state. On the other hand, the connecting node 82 stays at the "high" state as the signal EB2 of FIG. 2 is kept at the "low" state, and thus the output of the inverter 92 goes to the "low" state. Hence, the output of the NOR gate 76 receiving the outputs of the inverters 74 and 92 being at the "low" states goes to the "high" state and the burn-in signal $\overline{BI}$ goes to the "low" state through the inverter 78. The output of the burn-in signal $\overline{BI}$ is inputted to the decoder which selects the row and column, as shown in FIG. 4, to cause the decoder to enable desired rows and columns. In FIG. 4, the NAND gates 100 and 102 and the inverter 104 are pre-decoders receiving the output of an address buffer (not shown). If the input signals AiP and AjP are all at the "high" states, the output of the signal ABCD$\overline{i}$ goes to the "low" state to thereby select the plurality of rows and columns. As earlier discussed, if the burn-in signal $\overline{BI}$ goes to the "low" state, the signal ABCD$\overline{i}$ is always kept at the "low" state regardless of the signals AiP and AjP to enable the plurality of rows and columns. After the burn-in test is completed by enabling the plurality of rows and columns, i.e., all the rows and columns in the chip prior to the proceeding of the postburn-in test, if a specific I/O input signal 11000101 is applied, the outputs of the NOR gates 40 and 42 of FIG. 2 go to the "low" states. Thereby, the output of the NAND gate 44 is at the "high" state and the inverter 46 is at the "low" state. Further, the output of the NAND gate 48 is at the "high" state and the inverter 50 is at the "low" state. Through the NAND gate 54 and the inverter 56, the signal EB2 is changed to the "high" state. Thus, the second fuse 80 of FIG. 3 is cut off, so the connecting node 82 goes to the "low" state and the output of the inverter 92 goes to the "high" state. Under this condition, the output of the NOR gate 76 is in the "low" state and the burn-in signal $\overline{BI}$ goes to the "high" state through the inverter 78, thereby returning to the normal mode. In addition, the inputs of the NAND gate 94 go to the "high" states and the burn-in control signal CBI through the inverters 96 and 98 goes to the "low" state. The burn-in control signal CBI is inputted to the NAND gates 30 and 48 of FIG. 2, resulting in non-operation of the burn-in control part of FIG. 3. As a result, the burn-in control circuit 10 according to the present invention can easily perform the burn-in test after the package of chip is completed. As illustrated in FIG. 4, since the output of the decoder can disregard its address input during burn-in, there is an advantage in that the burn-in test is executed for all the memory cells placed on the same chip, at the same time.

Figure 5:
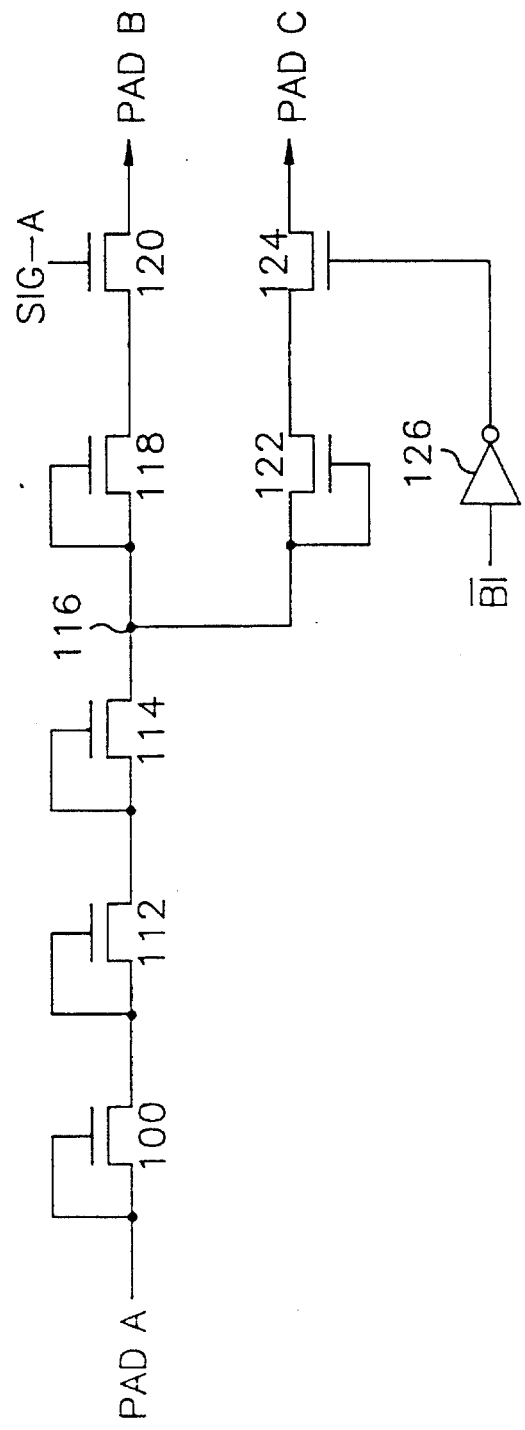
FIG. 5 is a circuit diagram illustrating an embodiment of a mode reading circuit for detecting a mode of a chip after the completion of a package.

FIG. 5 is a circuit diagram illustrating an embodiment of a mode reading circuit for reading whether a chip in a package state is in the preburn-in mode or passes through the burn-in test. In the figure, pads A, B and C can be easily used as three specific pads in a plurality of pads formed on the same chip. A signal SIG-A as supplied to a control signal is the output signal of the inverter 74 of FIG. 3. The mode reading circuit includes an NMOS transistor 110 which is connected commonly to the pad A at drain and gate terminals thereof, an NMOS transistor 112 which is connected commonly to the source terminal of the NMOS transistor 110 at drain and gate terminals thereof, an NMOS transistor 114 which is connected commonly to the source terminal of the NMOS transistor 112 at drain and gate terminals thereof, a connecting node 116 which is connected to the drain terminal of the NMOS transistor 114, an NMOS transistor 118 which is connected commonly to the connecting node 116 at drain and gate terminals thereof, an NMOS transistor 120 whose channel is formed between the source terminal of the NMOS transistor 118 and the pad B and whose gate is connected to the signal SIG-A, an NMOS transistor 122 which is connected commonly to the connecting node 116 at drain and gate terminals thereof, and an NMOS transistor 124 whose channel is formed between the source terminal of the NMOS transistor 122 and the pad C and whose gate is connected to the burn-in signal $\overline{BI}$ with an inverter 126 intervened therebetween. In the constitution, it is possible to check whether the internal state of chip is in the preburn-in mode, burn-in mode or postburn-in mode through the NMOS transistors 110 to 124 (as can be known from the constitution shown in FIG. 5, the NMOS transistors operate as diode). For example, before the burn-in state, i.e., in case where the first fuse 60 remains as it is, the signal SIG-A goes to the "high" state and leakage current is formed from pin to pin. That is, if the pin connected to the pad B keeps ground GND and a predetermined voltage is applied to the pin connected to the pad A, such leakage current is generated. In the burn-in state, when the burn-in signal $\overline{BI}$ goes to the "low" state, the NMOS transistor 124 is turned on. At this time, if the pin connected to the pad B keeps ground GND, the leakage current is generated from the pad A. By using such methods discussed above, in the preburn-in mode, the device mode can be known by estimating the leakage current flowed from the pad A to the pad B, and in the burn-in mode, from the pad A to the pad C. Furthermore, in the postburn-in mode, the device mode can be known since no leakage current path is formed.

While the invention has been particularly shown and described with reference to a preferred embodiment, it will be understood by those skilled in the art that modifications in detail may be made without departing from the spirit and scope of the invention. By way of example, the circuits embodied in FIGS. 3 to 5 on the basis of the block diagram of FIG. 1 according to the present invention may be modified in consideration of logic and device characteristic of each signals. In addition, the example of eight pins is shown in the present invention, but it is possible that the number of pins may be varied. In the meanwhile, as shown in FIG. 4, if the burn-in signal $\overline{BI}$ according to the present invention is connected to all the decoders, the burn-in test for all of the memory cells placed on the same chip can be performed at a time, which may be changed by the intention of the designer.

As previously discussed, the burn-in circuit and method therefor according to the present invention can execute the burn-in test after the completion of package of a chip and simultaneously execute the burn-in test for all of the memory cells placed on the same chip, so that the time consumed by the burn-in test is considerably reduced. Moreover, since the burn-in test is carried out after the package process, there is an advantage in that a separate test equipment is not necessary for burn-in testing in the wafer state. In addition, a burn-in circuit and method according to the present invention can perform a reliable burn-in test in a package state for a semiconductor memory device such as a static RAM.

What is claimed is:

1. A semiconductor memory device including a memory cell array which has a plurality of memory cells that are accessed in response to an address which is provided to row and column decoders, said semiconductor memory device comprising:

an input/output line control circuit connected between data input/output pins and columns of the memory cells, for selectively transmitting data provided from the memory cell array to the data input and output pins or data provided from the data input and output pins to the memory cell array in response to read and write signals, said data provided from the data input and output pins being outputted to be used as a burn-in test data during a burn-in operation of the memory cell array;

a read/write control circuit for supplying the read and write signals to the input/output line control circuit, and outputting a write burn-in signal which is generated by the write signal; and a burn-in control circuit for receiving said write burn-in signal and said data provided from the data input and output pins, and supplying a burn-in signal to said row and column decoders, thereby performing the burn-in operation of the memory cell array after a package process to the device is finished.

2. The semiconductor memory device as defined in claim 1, wherein said burn-in control circuit supplies said burn-in signal to all of said row and column decoders placed on the same chip as a chip of the device, and thus a burn-in test is performed for all the memory cells stored in said memory cell array, at a time.

3. The semiconductor memory device as defined in claim 1, wherein said burn-in control circuit comprises:

an input switching part for inputting data supplied from said input/output line control circuit and outputting an output signal responsive thereto in correspondence with the output signal of said read/write control circuit; and a burn-in control part having a fuse cut off by the output signal of said input switching part, for generating said burn-in signal in response to the cutting operation of said fuse.

4. A semiconductor memory device including a memory cell array in which a plurality of memory cells are stored in the directions of row and column, a row decoder for selecting the row of the memory cell array, a column decoder for selecting the column of the memory cell array, an input/output line control circuit formed between a data input/output pin disposed on the same chip and the column of the memory cell array for transmitting data inputted/outputted through the data input/output pin, and a read/write control circuit for supplying a signal which controls input/output of data in the memory cell array to the input/output line control circuit, said device comprising:

a burn-in mode enable part for inputting data provided from said input/output line control circuit and in response thereto outputting a burn-in mode enable signal in correspondence with an output signal of said read/write control circuit;

a normal mode enable part for inputting data provided from said input/output line control circuit and in response thereto outputting a normal mode enable signal in correspondence with an output signal of said read/write control circuit;

a burn-in signal generating part having a first fuse cut off by inputting an output signal of said burn-in mode enable signal, for generating a burn-in signal in response to the cutting operation of said first fuse and supplying said burn-in signal to said row decoder and said column decoder; and a burn-in control signal generating part having a second fuse cut off by inputting an output signal of said normal mode enable signal, for generating a burn-in control signal in response to the cutting operation of said second fuse and supplying said burn-in control signal to said burn-in mode enable part and said normal mode enable part.

5. The semiconductor memory device as defined in claim 4, wherein said burn-in control generating part supplies said burn-in signal to all of said row decoder and said column decoder placed on the same chip, and thus a burn-in test is performed for all the memory cells stored in said memory cell array, at a time.

6. The semiconductor memory device as defined in claim 4, wherein said semiconductor memory device performs said burn-in test when said first fuse is cut off in response to said burn-in mode enable signal, and proceeds with a normal mode when said second fuse is cut off in response to said normal mode enable signal.

7. The semiconductor memory device as defined in claim 6, wherein said semiconductor memory device proceeds with a normal mode when said first and second fuses are not cut off.

8. The semiconductor memory device as defined in claim 4, wherein said burn-in mode enable part comprises:

a first NOR gate for inputting the predetermined number of signals of a plurality of data input signals inputted from a plurality of input pins;

a second NOR gate for inputting the rest of the predetermined number of data input signals;

a first NAND gate for inputting a control signal which is generated by a write enable signal and informs the approach to a burn-in mode and inputting the output signal of each of said first and second NOR gates;

a first inverter for inputting the output signal of the first NAND gate;

a second NAND gate for inputting said burn-in control signal and the output signal of said first inverter;

a second inverter for inputting the output signal of said second NAND gate;

a delay circuit for delaying for a predetermined time the output signal of said second inverter;

a third NAND gate for inputting the output signals of said second inverter and said delay circuit; and a third inverter for inputting the output signal of said third NAND gate and outputting said burn-in mode enable signal.

9. The semiconductor memory device as defined in claim 4, wherein said normal mode enable part comprises:

a first NOR gate for inputting the predetermined number of signals of a plurality of data input signals inputted from a plurality of input pins;

a second NOR gate for inputting the rest of the predetermined number of data input signals;

a first NAND gate for inputting a control signal which is generated by a write enable signal and informs the approach to a burn-in mode and inputting the output signal of each of said first and second NOR gates;

a first inverter for inputting the output signal of the first NAND gate;

a second NAND gate for inputting said burn-in control signal and the output signal of said first inverter;

a second inverter for inputting the output signal of said second NAND gate;

a delay circuit for delaying for a predetermined time the output signal of said second inverter;

a third NAND gate for inputting the output signals of said second inverter and said delay circuit; and a third inverter for inputting the output signal of said third NAND gate and outputting said normal mode enable signal.

10. The semiconductor memory device as defined in claim 4, wherein said burn-in signal generating part comprises:

a first fuse connected between a supply voltage and a first connecting node;

a first transistor having a channel connected between said first connecting node and ground and having a gate terminal to which said burn-in mode enable signal is supplied;

a first inverter connected to said first connecting node at the input terminal thereof;

a second transistor having a channel connected between said first connecting node and ground and having a gate terminal to which the output signal of said first inverter is supplied;

a second inverter for inputting an output signal of said first inverter;

a NOR gate for inputting an output signal of said second inverter as one input; and a third inverter for inputting an output signal of said NOR gate and outputting said burn-in signal.

11. The semiconductor memory device as defined in claim 10, wherein said burn-in control signal generating part comprises:

a second fuse connected between a supply voltage and a second connecting node;

a third transistor having a channel connected between said second connecting node and ground and having a gate terminal to which said normal mode enable signal is supplied;

a fourth inverter connected to said second connecting node at the input terminal thereof and whose output signal is supplied to said NOR gate as one input;

a fourth transistor having a channel connected between said second connecting node and ground and having a gate terminal to which the output signal of said fourth inverter is supplied; and an NAND gate for inputting output signals of said fourth and first inverters and outputting said burn-in control signal.

12. A semiconductor memory device including a memory cell array in which a plurality of memory cells are stored in the directions of row and column, a row decoder for selecting the row of the memory cell array, a column decoder for selecting the column of the memory cell array, an input/output line control circuit formed between a data input/output pin disposed on the same chip and the column of the memory cell array for transmitting data inputted/outputted through the data input/output pin, and a read/write control circuit for supplying a signal which controls input/output of data in the memory cell array to the input/output line control circuit, said device comprising:

an input switching part for inputting data supplied from said input/output line control circuit and outputting an output signal responsive thereto in correspondence with the output signal of said read/write control circuit;

a burn-in control part having a fuse cut off by the output signal of said input switching part, for generating said burn-in signal in response to the cutting operation of said fuse; and a mode reading circuit, including a first pad, a second pad, a third pad, a first diode group in which a current path is formed between said first and second pads, and a second diode group in which a current path is formed between said first and third pads, for reading whether a burn-in mode on the same chip is performed through leakage current generated by the voltage supplied to said first, second and third pads.

13. The semiconductor memory device as defined in claim 12, wherein said burn-in control circuit supplies said burn-in signal to all of said row decoder and said column decoder placed on the same chip, and thus a burn-in test is performed for all the memory cells stored in said memory cell array, at a time.

14. The semiconductor memory device as defined in claim 12, wherein said input switching part comprises:

a burn-in mode enable part for inputting data provided from said input/output line control circuit and in response thereto outputting a burn-in mode enable signal in correspondence with an output signal of said read/write control circuit; and a normal mode enable part for inputting data provided from said input/output line control circuit and in response thereto outputting a normal mode enable signal in correspondence with an output signal of said read/write control circuit.

15. The semiconductor memory device as defined in claim 14, wherein said burn-in control part comprises:

a burn-in signal generating part having a first fuse cut off by inputting an output signal of said burn-in mode enable signal, for generating a burn-in signal in response to the cutting operation of said first fuse and supplying said burn-in signal to said row decoder and said column decoder; and a burn-in control signal generating part having a second fuse cut off by inputting an output signal of said normal mode enable signal, for generating a burn-in control signal in response to the cutting operation of said second fuse and supplying said burn-in control signal to said burn-in mode enable part and said normal mode enable part.

16. The semiconductor memory device as defined in claim 12, wherein said first and second diode groups are respectively comprised of a plurality of NMOS transistors connected in series to each other.

17. A burn-in method of a semiconductor memory device including a memory cell array in which a plurality of memory cells are stored in the directions of row and column, a row decoder for selecting the row of the memory cell array, a column decoder for selecting the column of the memory cell array, an input/output line control circuit formed between a data input/output pin disposed on the same chip and the column of the memory cell array for transmitting data inputted/outputted through the data input/output pin, and a read/write control circuit for supplying a signal which controls input/output of data in the memory cell array to the input/output line control circuit, said method comprising the steps of:

inputting data provided from said input/output line control circuit and in response thereto outputting a burn-in mode enable signal by a burn-in mode enable part in correspondence with an output signal of said read/write control circuit;

inputting data provided from said input/output line control circuit and in response thereto outputting a normal mode enable signal by a normal mode enable part in correspondence with an output signal of said read/write control circuit;

generating a burn-in signal by a burn-in signal generating part having a first fuse cut off by inputting an output signal of said burn-in mode enable signal, in response to the cutting operation of said first fuse and supplying said burn-in signal to said row decoder and said column decoder; and generating a burn-in control signal by a burn-in control signal generating part having a second fuse cut off by inputting an output signal of said normal mode enable signal, in response to the cutting operation of said second fuse and supplying said burn-in control signal to said burn-in mode enable part and said normal mode enable part.

18. The burn-in method of the semiconductor memory device as defined in claim 17, wherein said burn-in signal generating part supplies said burn-in signal to all of said row decoder and said column decoder placed on the same chip, and thus a burn-in test is performed for all the memory cells stored in said memory cell array, at a time.

19. The burn-in method of the semiconductor memory device as defined in claim 17, wherein said semiconductor memory device performs said burn-in test when said first fuse is cut off in response to said burn-in mode enable signal, and proceeds with a normal mode when said second fuse is cut off in response to said normal mode enable signal.

20. The burn-in method of the semiconductor memory device as defined in claim 19, wherein said semiconductor memory device proceeds with a normal mode when said first and second fuses are not cut off.

21. A burn-in method of a semiconductor memory device including a memory cell array in which a plurality of memory cells are stored in the directions of row and column, a row decoder for selecting the row of the memory cell array, a column decoder for selecting the column of the memory cell array, an input/output line control circuit formed between a data input/output pin disposed on the same chip and the column of the memory cell array for transmitting data inputted/outputted through the data input/output pin, and a read/write control circuit for supplying a signal which controls input/output of data in the memory cell array to the input/output line control circuit, said method comprising the steps of:

inputting data provided from said input/output line control circuit and in response thereto outputting a burn-in mode enable signal by a burn-in mode enable part in correspondence with an output signal of said read/write control circuit;

inputting data provided from said input/output line control circuit and in response thereto outputting a normal mode enable signal by a normal mode enable part in correspondence with an output signal of said read/write control circuit;

generating a burn-in signal by a burn-in signal generating part having a first fuse cut off by inputting an output signal of said burn-in mode enable signal, in response to the cutting operation of said first fuse and supplying said burn-in signal to said row decoder and said column decoder;

generating a burn-in control signal by a burn-in control signal generating part having a second fuse cut off by inputting an output signal of said normal mode enable signal, in response to the cutting operation of said second fuse and supplying said burn-in control signal to said burn-in mode enable part and said normal mode enable part; and reading whether a burn-in mode on the same chip is performed through leakage current generated by a voltage supplied to each of first, second and third pads by a mode reading circuit including a first diode group in which a current path is formed between said first and second pads, and a second diode group in which a current path is formed between said first and third pads.

22. The burn-in method of the semiconductor memory device as defined in claim 21, wherein said burn-in signal generating part supplies said burn-in signal to all of said row decoder and said column decoder placed on the same chip, and thus a burn-in test is performed for all the memory cells stored in said memory cell array, at a time.

23. The burn-in method of the semiconductor memory device as defined in claim 21, wherein said semiconductor memory device performs said burn-in test when said first fuse is cut off in response to said burn-in mode enable signal, and proceeds with a normal mode when said second fuse is cut off in response to said normal mode enable signal.

24. The burn-in method of the semiconductor memory device as defined in claim 23, wherein said semiconductor memory device proceeds with a normal mode when said first and second fuses are not cut off.

* * * * *